(12) United States Patent
Redden et al.

(10) Patent No.: US 7,547,425 B2
(45) Date of Patent: *Jun. 16, 2009

(54) COLD-WALLED VESSEL PROCESS FOR COMPOUNDING, HOMOGENIZING AND CONSOLIDATING SEMICONDUCTOR COMPOUNDS

(75) Inventors: Robert Francis Redden, Victoria (CA); Weidong Huang, Boston, MA (US); Troy Oran Hasanen, Victoria (CA)

(73) Assignee: Redlen Technologies, Sidney, British Columbia (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/232,185

(22) Filed: Sep. 11, 2008

(65) Prior Publication Data
US 2009/0060829 A1    Mar. 5, 2009

Related U.S. Application Data (63) Continuation of application No. 11/471,734, filed on Jun. 21, 2006, now Pat. No. 7,427,382.

(30) Foreign Application Priority Data
Jun. 21, 2005    (CA) .................................. 2510415

(51) Int. Cl.
*C01B 19/00* (2006.01)
*C01B 19/04* (2006.01)
*B01J 19/00* (2006.01)

(52) U.S. Cl. ............................. 423/1; 423/99; 423/508; 423/509; 423/511; 423/566.1; 23/295 R; 438/102; 422/129

(58) Field of Classification Search ............... 423/1, 423/99, 508, 511, 566.1, 509; 23/295 R; 438/102; 422/129
See application file for complete search history.

(56) References Cited

U.S. PATENT DOCUMENTS

| | | | |
|---|---|---|---|
| 3,330,251 | A | 7/1967 | Gutsche |
| 3,777,009 | A | 12/1973 | Menashi et al. |
| 4,465,527 | A | 8/1984 | Nishizawa |
| 4,654,196 | A | 3/1987 | Fillot et al. |
| 6,673,647 | B2 | 1/2004 | Pelliciari |
| 6,780,244 | B2 | 8/2004 | Kawase et al. |
| 7,002,230 | B2 | 2/2006 | Hirano et al. |
| 7,014,702 | B2 | 3/2006 | Zappettini et al. |
| 7,427,382 | B2 * | 9/2008 | Redden et al. .................. 423/1 |
| 2006/0037177 | A1 | 2/2006 | Blum et al. |

FOREIGN PATENT DOCUMENTS

| | | |
|---|---|---|
| EP | 1 013 801 A1 | 6/2000 |
| WO | WO 2006/054580 A1 | 5/2006 |

* cited by examiner

*Primary Examiner*—Timothy C Vanoy
(74) *Attorney, Agent, or Firm*—Foley & Lardner LLP (57) ABSTRACT

A method is provided for compounding, homogenizing and consolidating compounds. In one embodiment, the charge components are mixed in a controlled addition process, then the newly-formed compound is heated to become totally molten, followed by a rapid quench at room temperature. In an alternate embodiment, the components are supplied with an excess of one component acting as a solvent, heated to dissolve additional components, and then the solvent is separated from the compound to produce homogeneous consolidated compounds. The methods herein are advantageously applied to provide an economical and fast process for producing CdTe, CdZnTe and ZnTe compounds.

10 Claims, 9 Drawing Sheets

70 Supplying Te, Cd and Zn charge in an ampoule, with an excess of Te, and a flowing hydrogen environment following evacuation.

72 placing the ampoule in a furnace

74 Raising the furnace temperature and heating ampoule, to 580 C at 200 C/hr and soak for 4 hrs, such that the Cd and Zn are soluble in the Te 76 Rapidly raise the furnace temperature to heat the ampoule to 890C at 25C/Hr and soak for 1 hr to homogenize contents 78 Rapidly quenching the ampoule by removing it from the furnace at room temperature

COLD-WALLED VESSEL PROCESS FOR COMPOUNDING, HOMOGENIZING AND CONSOLIDATING SEMICONDUCTOR COMPOUNDS

CROSS-REFERENCE TO RELATED APPLICATIONS

This application is a Continuation of U.S. application Ser. No. 11/471,734, filed Jun. 21, 2006, which claims priority from Canadian patent application CA 2,510,415, filed Jun. 21, 2005. The entire contents of each of the aforementioned applications are incorporated herein by reference.

TECHNICAL FIELD

The present invention relates generally to a method and apparatus for forming a compound semiconductor crystal and, more particularly, to a method and apparatus for compounding, homogenizing and consolidating semiconductor compounds, especially Cadmium Zinc Telluride ("CdZnTe" or "CZT") or Cadmium Telluride ("CdTe") in accordance with using a cold-walled vessel.

BACKGROUND OF THE INVENTION

There is a wide range of ternary and quaternary II-VI and III-V semiconductor compounds, which are difficult to grow into high quality single crystals from the melt. Principally, there are these four reasons: very high melting points, non-congruent melting, decomposition or evaporation on melting or having a melting point above the desirable crystallographic phase.

For example, totally molten CZT requires a temperature in excess of 1100° C. (above its liquidus temperature). A hot-walled or a vessel under high inert gas pressure is thus required to prevent the molten CZT from decomposing/subliming to the cooler locations. Such pressures may exceed 100 atmospheres, requiring expensive reactors.

Several growth methods have been used for the growth of bulk CZT. These include Horizontal Bridgman (HB) and Vertical Bridgman (VB) or Vertical Gradient Freeze (VGF) in sealed systems; High Pressure Vertical Bridgman (HPVB) in unsealed ampoules; the Traveling Solvent Method (TSM) and the Traveling Heater Method (THM).

Limitations of Current Art

There are many limitations and problems with Bridgman-type melt growth methods. Varying gradients and uncontrolled temperature fluctuations at the crystal growth interface serve to induce crystal defects and inhomogeneities. Processes requiring fused sealed ampoules or "closed tubes" incur the additional cost burden of single-use ampoules. Specifically for CZT, the Bridgman VGF method produces large axial variations in Zn concentration, because of the non-congruent melting property. Additionally, the relatively long temperature ramps and slow growth rate again increase the cost of forming CZT by this method.

The reaction to compound CZT from elemental Cd, Zn and Te is highly exothermic and unstable. It can occur unpredictably with explosive force. The consequence of such explosions may include damage to the apparatus, loss of expensive reagents, distribution of toxic materials into the environment and risks to those personnel in the vicinity. To mitigate against these effects expensive explosion-proof apparatus and facilities are necessary.

The three constituents, Cd, Zn and Te, each have different melting points below the melting point of CZT. As the temperature reaches the range~600-900 C unreacted liquid Te, liquid Cd and liquid Zn attempt to coexist with solid CZT already formed through the reaction of the components. As the temperature rises various reactions continue to occur between liquids and solids and between liquids and liquids to form other liquid or solid intermediaries or the desired CZT end product. The mixture is highly heterogeneous in terms of the solid, liquid and vapour phases and in terms of the temperature distribution in the reaction vessel. The rate of reaction is influenced both by the chance contact of reagents and intermediate compounds and by the extent of the heat generated—raising the local, and therefore the average, temperature and further accelerating the reaction. Very high Cd vapour pressures can occur, for example, if unreacted elemental Cd is suddenly heated to a high temperature.

The high temperatures for long periods typical in melt growth processes can cause oxides to build up on the boule surface, resulting in the boule adhering to the walls of the containment vessel, such as a quartz ampoule. This may cause difficulty in releasing the boule from the vessel. Additionally, due to the high temperatures of ~1100° C. at peak and for an extended duration in conventional CZT compounding processes contaminants can leach from the quartz ampoule.

Typically, sealed ampoules used in VGF compounding processes require a portion of the sealed ampoule to be cut off to extract the boule, causing waste and possibly precluding reuse of the ampoule. The VGF ampoules must be evacuated to high vacuum and use a quartz/quartz fused seal. If a slow leak occurs during the subsequent heating cycle the ampoule is highly probable of rupturing.

Many problems of compounding additional materials are specific to each material, and its intended subsequent use. Important compounds are ZnTe, CdTe, and presaturated CZT solvent used to grow large-grained CZT crystals. Each of these is briefly summarized. The greater the quality of polycrystalline compounded material the greater the chance of subsequently re-crystallizing it into excellent single crystal material.

An example of a compound requiring a very high temperature is ZnTe. The melting point of zinc telluride is ~1239° C., so compounding ZnTe via direct melting would require expensive coated quartz ampoules or higher temperature crucibles, which are prone to contaminate their contents with heavy metals.

CdTe is an important compound for detectors and energy conversion devices, and has a melting point above the desired crystallographic phase. It also decomposes/evaporates on melting. Sealed, single use, ampoules are necessary to contain the pressures generated. Excess Te as a solvent is frequently used to reduce the reaction temperature but this slows the rate of reaction and triggers other problems.

A Te rich CZT solvent formulation can be used for growth of CZT crystals. Preparing this formulation having excess Te, by conventional methods, results in inhomogeneity and improper stoichiometry, for example saturating the Te solvent with standard feed that has a Cd/Zn ratio of 9:1 has two disadvantages. Firstly, it means using more expensive synthesized feed rather than the elements, and secondly the Cd:Zn ratio is not the equilibrium value and causes instabilities and Zn inhomogeneities in the subsequent process.

Cost issues due to slow processes and high cost reactor equipment are common to the previous conventional compounding techniques. Contamination from reactor vessel leachate and oxides are also a common problem.

Techniques used to stabilize the compounding of other highly reactive materials in other industries frequently are inapplicable with respect to semiconductors, especially CZT, CdTe and ZnTe.

SUMMARY

According to one aspect of the present invention, a method of compounding, homogenizing and consolidating compounds is provided, one selected from the group of compounds with either very high melting points, or non-congruent melting points, or which decompose on melting due to volatile components, or have a melting point above the desirable crystallographic phase, and including at least a first component and a second component, and using a reactor and a cold-walled ampoule with gas line coupling, and charge container; the steps as described below:

Supplying in a charge container, at least one volatile or reactive first solute component and a second solvent component in a ampoule in a first lower region, such that the charge container is coupled inside the ampoule in a second upper position, separated from a lower region, and a flowing hydrogen gas environment following vacuum evacuation of said ampoule and charge. Placing the ampoule in a reactor having upper and lower heating zones such that temperature in each zone is independently controllable, in a position such that the upper and lower regions of the ampoule are matched to the upper and lower heating zones of the reactor. Then, raising the lower reactor zone temperature such that the second component is liquid and the first component is soluble in the second component. Then raising the upper reactor zone temperature such that the at least one first solute component is melted and added to the second solvent component at a rate such that resulting vapor pressure from the exothermic reaction of mixing is absorbed in a flowing hydrogen environment continuously passing through a surge tank, and maintaining temperature until at least one first solute component has completely melted and mixed with the second solvent component. Rapidly raising the lower reactor zone temperature above the temperature required for totally melting the compound and maintaining same for a short duration. Then rapidly quenching at room temperature by removing the ampoule from reactor.

The method may be conducted with at least one region of the cold-walled ampoule is maintained continuously at a lower temperature, such as ambient room temperature, and the first and second components are synthesized in the form of a homogeneous and consolidated compound material.

According to another aspect of the present invention, a method of compounding, homogenizing and consolidating compounds is provided, one selected from the group of compounds with either very high melting points, or non-congruent melting points, or decomposing on melting due to volatile elements, or have a melting point above the desirable crystallographic phase, and including at least a first component and a second component, and using a reactor and cold-walled ampoule with gas line coupling; the steps as described below:

Supplying in a cold walled ampoule, at least one volatile or reactive first component and a second component, with the proportions of the components in the charge being such that the second component is used as a solvent, and a flowing hydrogen gas environment following vacuum evacuation of the ampoule and charge. Placing the ampoule in a reactor. Raising the reactor temperature such that the second component is liquid and the first component is soluble in said second component. Translating the cold-walled ampoule such that said charge in said ampoule shows a cold point where the solidification of the compound takes place, at a rate <10 mm/day, until said charge is solidified. Separating the solidified compound from the solvent remainder. The method having conditions wherein at least one region of said cold-walled ampoule is maintained continuously at ambient room temperature, and the first and second components are synthesized in the form of a homogeneous and consolidated compound material.

According to another aspect of the present invention, a method is provided of compounding, homogenizing and consolidating ZnTe compounds, using a reactor and cold-walled ampoule with gas line coupling, and charge container; the steps as described below Supplying elemental Zn in a charge container, and Te in an ampoule in a first lower region, such that the charge container is coupled inside the ampoule in a second upper position, separated from said lower region, and a flowing hydrogen gas environment following vacuum evacuation of the ampoule and charge. The vacuum is backfilled with hydrogen that continues to flow throughout the process. Placing the ampoule in a reactor having upper and lower heating zones such that the temperature in each zone is independently controllable, in a position such that the upper and lower regions of the ampoule are matched to the upper and lower heating zones of said reactor. Raising the lower reactor zone to substantially 700° C., such that the Te is molten. Raising the upper reactor zone temperature quickly to substantially 600° C. such that the Zn is melted and added to the Te solvent at a controlled drip rate until all the Zn is dripped into and reacted with the Te to form ZnTe, which is dissolved in the Te. Translating the cold-walled ampoule such that the solution in the ampoule shows a cold point where the directional solidification of the compound takes place, at a rate of <10 mm/day, until the solution and solute is solidified. The conditions being wherein at least one region of the cold-walled ampoule is maintained continuously at ambient room temperature, and the Zn and Te are synthesized in the form of a homogeneous and consolidated stoichiometric ZnTe.

According to another aspect of the present invention, a method is provided for compounding, homogenizing and consolidating compounds, using a reactor and cold-walled ampoule with gas line coupling, the steps as below.

Supplying in a cold-walled ampoule, Cd, Zn and Te, with the proportions of the components in the charge being such that the Te is used as a solvent in excess, and a flowing hydrogen gas environment following vacuum evacuation of the ampoule and charge. Placing the ampoule in a reactor. Raising the reactor temperature such that the Te is liquid and the Cd and Zn are soluble in the Te. Rapidly raising the reactor zone temperature above the temperature required for at least 100% solubility of the Cd and Zn in the Te solvent, totally dissolving the compound and maintaining for several hours. Rapidly quenching the ampoule to room temperature by removing from the reactor. The method having conditions wherein at least one region of the cold-walled ampoule is maintained continuously at ambient room temperature, and the Cd, Zn and Te produce a homogeneous and consolidated presaturated solvent material.

BRIEF DESCRIPTION OF THE DRAWINGS

FIGS. 1A, 1B and 1C are schematic side cross sectional views of the VESSEL APPARATUS: FIG. 1A shows an ampoule, FIG. 1B shows a drip cup, and FIG. 1C shows the drip cup positioned in the ampoule as used in the methods of the embodiments of the invention.

DETAILED DESCRIPTION OF THE INVENTION

The following methods have been created to produce semiconductor compounds similar in quality to those made by conventional Vertical Gradient Freeze (VGF) methods but at much reduced costs, much faster and with a much reduced probability of explosion. CZT is normally synthesized from the three elements Cd, Zn and Te using the Bridgman or Vertical Gradient Freeze (VGF) process that requires long duration in complex multi-zone furnaces with sealed hot-walled containment or very high pressure inert gas vessels. The furnace in the disclosed methods is only operated at VGF-type high temperatures for a few minutes instead of many days, thus increasing furnace life dramatically and reducing operating costs. The cold-walled process, which uses a two- or three-zone furnace, can produce near-stoichiometric CZT (internal feed for subsequent crystal growth), polycrystalline, near-stoichiometric, pre-compounded CdTe for potential use in solar cell and other applications, and compounded ZnTe useable as feedstock for a thin film deposition reactor for use in IR optics and thin film solar cells.

The present inventors have discovered initially how to process pre-saturated solvent prepared in a few hours at atmospheric hydrogen pressure in a cold-walled vessel. The presence of significant Te in excess of the CZT stoichiometric requirement helps to control the violence of the exothermic synthesis activity thus eliminating the risks of ampoule rupture. The same methodology is applied to creating CZT feed when no excess Te is desirable. The elemental Cd and Zn can be added to the Te in a controlled manner via a secondary container (the so-called "Drip" method). The methods can be applied to other semiconductor compounds from the one of the following characteristic groups which: have very high melting points, have non-congruent melting points, decompose/evaporate on melting due to volatile elements, or have a melting point above the desirable crystallographic phase.

The "Drip" method of making a compound according to one embodiment includes providing a first liquid material located in a first vessel, such as an ampoule, and a second liquid material located in a second vessel, such as a drip cup. The liquid materials may be first provided in the solid state and then melted to the liquid state. The method further includes adding the second liquid material from the second vessel into the first liquid material located in the first vessel while the first liquid material is maintained at a temperature above a liquidus temperature of the first material and below a liquidus temperature of the compound of the first material and the second material. The method further includes maintaining the temperature of the first material and the second material above the liquidus temperature of the first material and below the liquidus temperature of the compound until the second liquid material is mixed with the first liquid material. This requires precise control of the rate of addition, and the drip method is an example of a controlled addition technique. The method also includes homogenizing and consolidating the mixture of the first liquid material and the second liquid material to form a solid compound of the first material and the second material.

Thus, unlike the prior art methods of mixing two liquid components of a compound in which the mixing is performed above the liquidus temperature of the compound, the mixing in the "Drip" method is performed below the liquidus temperature of the compound. However, since the liquidus temperature of the components (i.e., the first and the second materials) is lower than the liquidus temperature of the compound, by maintaining a relatively large amount of the solvent liquid and slowly dripping a relatively small amount of the solute liquid into the solvent, the solvent-solute mixture does not immediately solidify into the solid compound, despite being maintained below the liquidus temperature of the compound.

An "excess solvent" method of making a compound according to another embodiment of the invention includes providing a first material and a second material in a vessel, such that the vessel contains an excess of the first material than that required to make the compound of the first material and the second material. In other words, the vessel would contain an excess amount of the first material after all of the second material and a portion of the first material combine to form a compound. The method also includes heating the first and the second materials to a temperature above a liquidus temperature of the first material and below a liquidus temperature of the compound of the first material and the second material to melt the first material to form a solvent, such that the second material forms a soluble solute in the first material. The method also includes homogenizing and consolidating the mixture of the first material and the second material to form a solid compound of the first material and the second material.

Thus, unlike the prior art methods of melting two solid components of a compound above the liquidus temperature of the compound in order to mix the components, the melting in the excess solvent is performed below the liquidus temperature of the compound. However, since the liquidus temperature of the components of the compound is lower than the liquidus temperature of the compound itself, by maintaining a relatively large amount of the solvent liquid compared to a relatively small amount of the solute liquid, the solvent-solute mixture does not immediately solidify into the solid compound, despite being maintained below the liquidus temperature of the compound.

The following definitions and equivalents apply to the embodiments:

Furnace: maybe called a reactor system or heater system, and typically includes a heater coil or coils, thermocouple or thermocouples and temperature controller or temperature controllers for programmed thermal cycles.

Ampoule: a tube type of a vessel, such as a cylindrical tube (equivalent to a crucible).

Liquidus: this temperature is used synonymously with "melting point", but
can also be used to mean the temperature at which the material is all liquid, rather than semi-solid or solid, for compounds which have different liquidus and solidus temperatures.

Quench: rapid cooling of molten compound.

Cold-walled vessel process: a heating process using a vessel, such as an ampoule, having a portion at a lower temperature than a melting point of the elements being melted, for example room temperature, as opposed to a hot-walled vessel process in which the entire ampoule is sealed and heated overall to high temperatures, possibly for long durations, above the melting points of the elements. The vessel is preferably an "open-tube" type vessel in that the vessel is not permanently sealed, but has a removable cap seal through which vacuum can be created and ambient flowing gas introduced. The cooled or lower temperature portion of the vessel is preferably the upper end-cap region, as it is desired to maintain the seal integrity which can be damaged from high-temperatures or volatile vapors. Typically, the maximum temperature range for the lower temperature portion is such that the volatile element has insignificant vapor pressure, such as a pressure of 1 torr (1 mm of mercury or 0.001316 atmospheres) or less. For example for cadmium, at temperatures less than 200 degrees Celsius, the vapor pressure is much less than 1 torr. While the examples herein use room or ambient temperature for the cooled portion, the process can work within the higher range described, such as 25 to 200° C., for example. Thus, a portion of the vessel which is located adjacent to the inert gas flow inlet, such as adjacent to the gas line which provides the inert gas flow is maintained at a temperature of 200° C. or less, such as room temperature to 75° C. For a capped open tube type of vessel in which the gas line is connected to the cap rather than to the vessel, the term "adjacent to the gas line" includes a portion of the vessel which contacts the cap.

Solvent: the solvent should have a temperature dependent solubility, hence temperature of the solution can be reduced well below the total melt temperature. An example of this is that Te is a solvent for CdTe, ZnTe, and increasing the amount of Te proportional to CdTe and ZnTe can reduce the liquid state by several hundred ° C. in the example of CZT.

Inert gas: is any gas which does not substantially react with the materials being processed in the vessel. For example, the gas may comprise a noble gas (i.e., argon, helium, etc.), nitrogen, as well as gases which are normally reducing, such as hydrogen, forming gas, etc, but are not reactive with the materials being processed.

Compounding: may be called synthesis. In the case of CZT, the compounding forms a binary of CdTe and ZnTe from the elements.

There are two stages in the embodied methods, firstly synthesizing the compounds and controlling the exothermic reaction of the elements and, secondly, homogenizing and consolidating the synthesized compounds.

The first stage of the cold-walled vessel process effectively uses one of the elements as a solvent and at least one other element as the solute, with a critical pressure buffer feature of ambient hydrogen flow during the treatment. A first method for this stage is a controlled addition process, or drip method, in which the solvent is heated to liquid in a vessel holding at least one volatile element, which is added to the solvent in small portions in a controlled manner such that the instantaneous reaction of the mixing of the limited solute amount is acceptably stable and is not a runaway process. An example would be Te as the solvent and CdZn as the solute, for which Te has a temperature dependent solubility. The controlled addition process allows the resulting solution to be near-stoichiometric, without any excess of Te. One of the cold-walled vessel variants is to produce CdTe by the controlled addition method. If desirable it (controlled addition) can be used for synthesizing and consolidation of ZnTe, CdTe and CZT. These non-solvent processes (drip addition) require a temperature spike described later. However, particularly in the case of ZnTe, the requirement of temperature spike exceeding 1240° C. is not attractive and a special case is described.

A second method for the first stage is using an excess of solvent and heating a mixture of all elements. For Te as the solvent and CdZn as the solute, as the Te temperature is increased the CdTe and ZnTe is dissolved well below the total melting point of the constituents allowing a cold-walled vessel to be used, and the excess solvent controls the reaction of the solute. Controlling the degree of reaction eliminates the need for expensive explosion-proofing of the reactor system, and improves safety. The pressure of volatile elements is controlled by an ambient pressure of hydrogen in the cold-walled vessel, and does not require the entire vessel to be at the same temperature. By example, for Te as the solvent and Cd as the solute, solutions rich in Te have low partial pressures of Cd and Te, which is advantageous for controlling the process and enables use of a "cold-walled" arrangement with ambient pressure of a gas.

For both of these methods in the first stage of synthesis, the product is neither homogeneous nor consolidated. For the drip-method synthesis, it could be likened to a solid sponge-like mass. It is CZT that is a non-homogeneous and poorly consolidated solid with voids.

For the CZT material example, the details of this first stage include the following. The elemental Cd and Zn are added to the already molten Te at a controlled rate with a critical pressure control device to relieve transient over-pressure in the ampoule, i.e. a hydrogen flow continuously passing through a reversible flow silicone oil bubbler or surge tank. It should be noted that any other suitable pressure relieving devices may also be used. During the extremely exothermic synthesis, the shock of alternating evacuation and pressure generation is moderated by a surge tank (with oil) coupled to the gas lines attached to the cap of the cold walled vessel. The synthesis rate is observable by monitoring the oil bubbling activity visually. The Cd and Zn drip control is regulated by the area of holes in a suspended drip cup, and the temperature of the upper furnace zone. The process provides hydrogen reduction of the molten Te prior to the Cd/Zn heating and also any Cd or Zn oxides will remain in the cup. The Cd/Zn are dripped into the molten Te reservoir held in a range of 500-800° C.

The second stage of the cold-walled vessel process homogenizes and consolidates the compounds created by the first stage by one of two methods (i.e., by the Drip or the excess solvent methods), as follows. By way of an illustrative example of what is taught by this second stage, a 2" diameter CZT consolidated ingot from the synthesis phase can be placed in a 3" ampoule and heated to a temperature and duration at which the compound melts, and is then cooled to consolidate in a 3" diameter form of solid, uniform CZT. This consolidation and homogenization process is valuable for recovery and recycling of small pieces of scrap or off-specification CZT.

For the case of the first stage using an excess of Te solvent (i.e., the Te excess solvent method), the second stage method is preferably translating the compound such that the solvent is separated to a heated area and the homogenized and consolidated compound freezes as it is cooled. Translation means to directionally freeze the melt in the furnace. This latter non-quenched final stage would be expected to have less internal voids but would not be as compositionally homogeneous. To minimize the CZT sublimation loss, it is desirable not to hold the material molten for long periods. In this case with the presence of excess Te, the material is heated to 900° C. (as opposed to the 1100° C. when there is no excess Te), and under this condition there is some slow evaporation of Te which is not detrimental to the process. The vessel is then translated such that the solution in the bottom of the vessel is moved to a cold region where the nucleation and the growth of the material takes place. Typically the rate of translation will vary depending on the compound. For CZT, a rate of approximately 2 mm/day is appropriate and many days are required to grow a sizable bulk feed sample. Following translation, the solvent can be extracted from the homogenous and consolidated crystal compound. For subsequent crystal growth using the produced CZT feed it is beneficial to have void-free feed with a density similar to the crystal to be grown.

For the case of the first stage using the Drip method, the second stage of homogenizing and consolidating has two variants. After all the volatile element is dropped into the solvent, the solution is still not homogenous, requiring an additional heating at elevated temperature to mix the elements to near-stoichiometry. This method is suited for a rapid compounding process that maintains stoichiometry of the elements in the compound, which is advantageous for a range of crystal growth processes. The compound can be heated very rapidly, temporarily in excess of the melting point for several minutes, to melt completely the compound. The ampoule is then rapidly quenched at room temperature. Note that this is not equivalent to melt growth durations, which may be up to 15 days. The short temperature spike ensures that the CZT compound is homogeneously mixed, and the short duration limits undesired stoichiometric changes due to vaporization. As opposed to a slow quench, the rapid quench freezes the homogeneity throughout the bulk ingot. An alternate variation combines Drip feed addition with an excess of Te in the first synthesis phase, followed by translation separation in the second phase.

For the CZT material example, a description of this second stage follows. On completion of the synthesis as indicated by the hydrogen flow having returned to the steady rate, the temperature of the bottom Te zone is increased to about 1130° C. Once the charge is observed to have been completely molten for approximately 5 minutes, and therefore for homogenization to have occurred, the ampoule is quenched to room temperature by its removal from the furnace. Thus, the homogenization step is preferably conducted for 10 minutes or less, such as about 3-7 minutes.

These cold-walled vessel methods of preparing compounds operate primarily at temperatures substantially below the total melting temperature, representing a dramatic improvement over the known art. The very short temperature spike above the compound melting point is used as a secondary homogenization treatment.

An advantage of the cold-walled vessel processes is that an economical and simple apparatus can be used. The reactor and vessel apparatus is somewhat similar for the various process embodiments herein. Differences will be described in each process where necessary.

Due to the features and benefits described, the cold-walled vessel process for compounding, homogenizing and consolidating semiconductor compounds is demonstrated to enable a) economical production of high quality, large-scale CZT, CdTe and ZnTe polycrystalline feedstock in shorter times and using less expensive reactors, b) low temperature growth from non-congruent melting materials such as CZT and CdTe, c) reduction of contamination and vapor pressure related problems of standard melt growth methods, d) improved homogeneity of constituents for enhancing subsequent single crystal growth, e) elimination of high cost explosion-proof furnace apparatus required for melt growth processes.

Apparatus

Figure 1A:
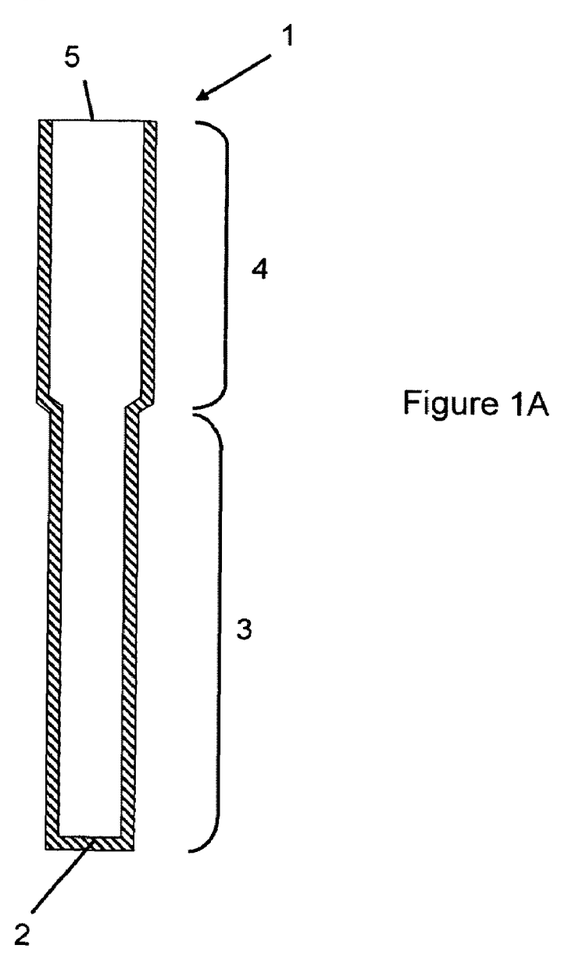

A cylindrical quartz ampoule 1 for cold-walled vessel compounding is shown in FIG. 1a, with two tapered regions 3, 4, a lower tapered region 3 ending in a flat bottom 2, and an upper tapered region 4. The lower tapered region 3 can be vacuum formed and the upper tapered region can be a second tube fused onto a first tube with the lower tapered region. For non-Drip addition examples, the same ampoule is used. A cap with valve assembly (not shown) is couplable to the top of the ampoule for providing vacuum and a flowing hydrogen environment. Connected to the gas lines is a critical pressure dampening device (not shown) to relieve transient over-pressure in the ampoule. This could take the form of a reversible flow silicone oil bubbler or surge tank through which the hydrogen flows. Alternatively the hydrogen can continuously pass through a surge tank, having a second reservoir to ensure the oil does not get sucked into the ampoule during the evacuation cycle. The secondary reservoir tap drains back into the main bubbler when the flow is normal. Other methods of pressure dampening known in the field can be substituted.

Figure 1B:
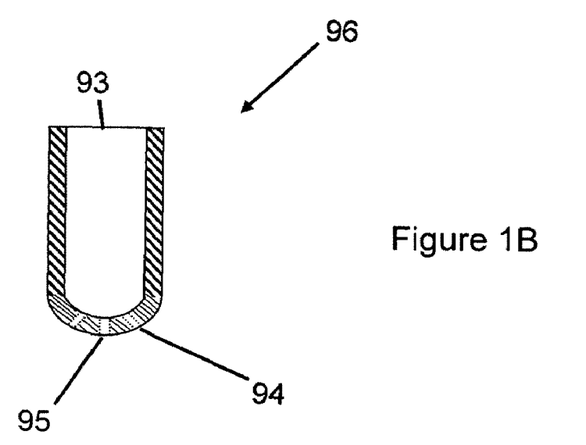

A cylindrical quartz compounding cup 96 (FIG. 1b) is designed to fit inside the upper portion of the ampoule 1 and has a curved bottom that seats within the upper tapered region 4 of the ampoule 1 when both are placed vertically. The cup 96 is open at the opposing end 93. The curved bottom portion has two holes, a central hole 95 (5 mm) and an angled hole 94 at 45 degrees to the cylinder axis. An example of the quartz specification for both can be GE124 semiconductor grade. It is desirable that there be a small gap between the cup and upper tapered zone to allow gas exchange with the top opening of the ampoule, and prevent pressure buildup during the reaction. In general, standard cleaning and handling techniques are used when preparing the charge materials and loading the ampoules and/or cup.

Figure 1C:
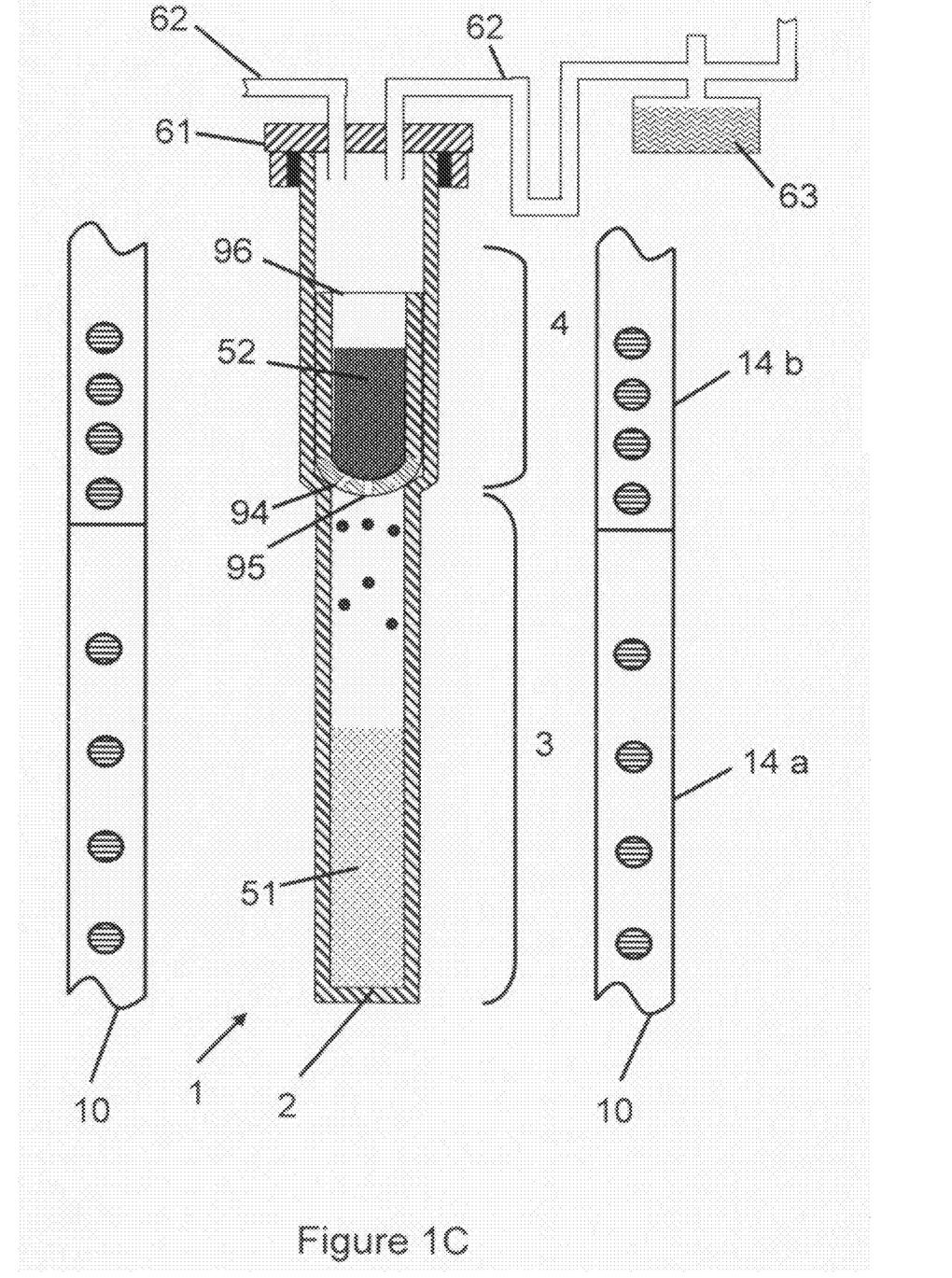

FIG. 1c illustrates the Drip method in which the cup 96 is provided inside region 4 of the ampoule 1. The solute 52, such as Cd or ZnCd, is melted in the cup 96 and is dripped down through holes 94, 95 into the solvent 51, such as Te, located in region 3 of ampoule 1. The ampoule is located inside a two heater zone 14a, 14b furnace 10. Each zone's temperature is separately controllable. Zone 14a is used to heat region 3 and zone 14b is used to heat region 4 containing cup 96. The cap with valve assembly 61 is coupled to the top of the ampoule 1 for providing vacuum and a flowing hydrogen environment. Connected to the gas lines 62 is the critical pressure dampening device 63 to relieve transient over-pressure in the ampoule.

Figures 8A, 8B:
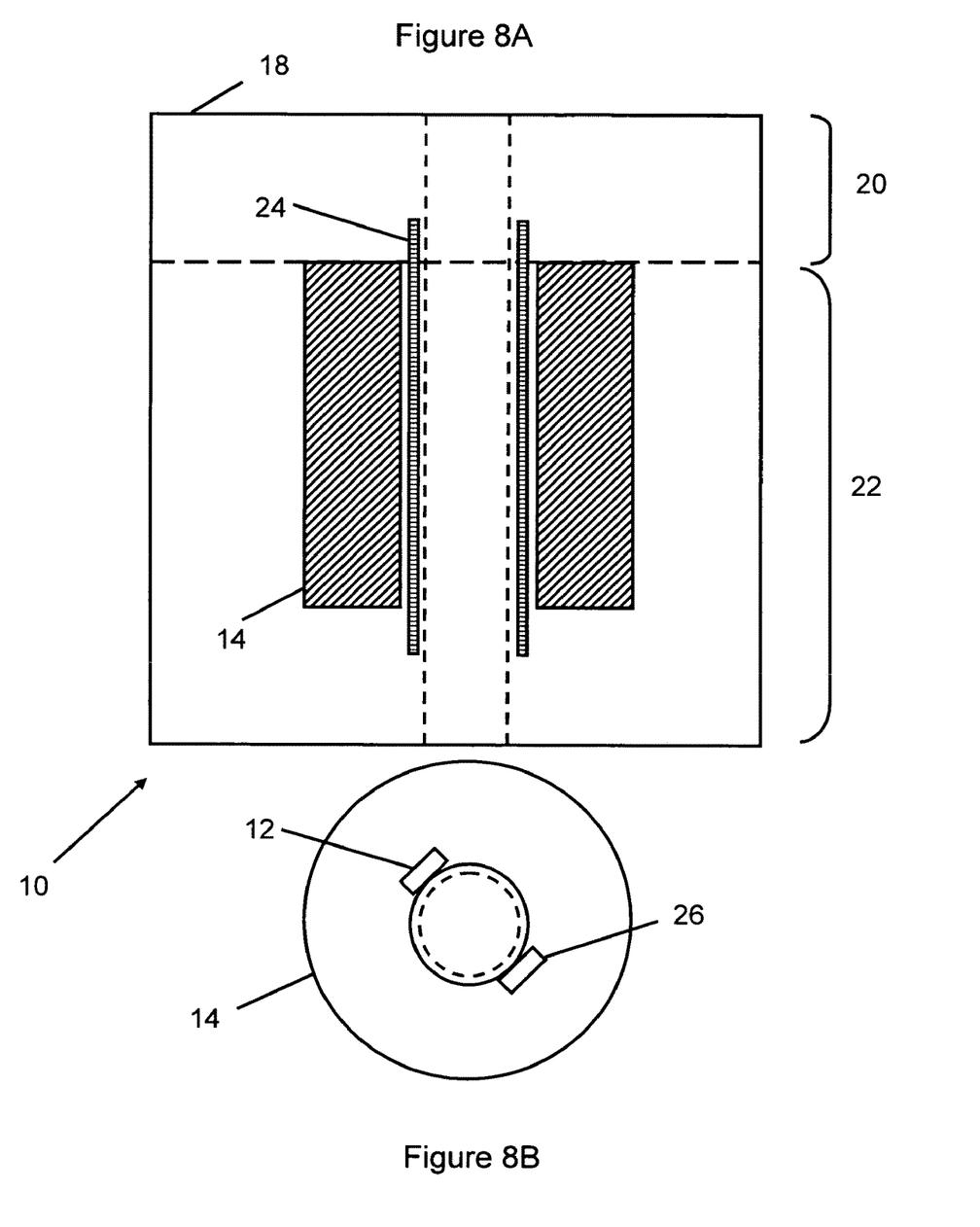
FIGS. 8A and 8B: REACTOR APPARATUS (SINGLE ZONE FURNACE): These figure schematically show the side cross section and top views, respectively, of the reactor designed to accommodate and heat the ampoule shown in FIG. 1A.

Any suitable furnaces can used in the cold walled vessel processes which can provide the desired amount of heat. For example, relatively standard furnaces can be used as precision control of interface temperature is not required. A basic single zone furnace 10 is shown in FIGS. 8A and 8B. A heater coil and core 14 is centered in the furnace having an inner diameter slightly larger than the ampoule 1, and surrounded by an insulating block 22 and 20, which can be made of any thermally insulating materials, such as fiberfrax and duraboard portions, respectively. The block may be topped with a thin layer of metal 18, such as aluminum. A liner tube 24 protects the ampoule from touching the heater core. The Drip-addition processes require independently controlled two heater zones (as shown by elements 14a, 14b in FIG. 1c) which is achieved by simply stacking two single zone furnaces 10, and similarly for three zone furnaces. Each heater zone 14 has a thermocouple 12 to allow for microprocessor control of the heating set points and heating and cooling rates. An electrical box 26 is connected by lead wires to the control system such as a computer or other microprocessor control logic. No special explosion-proof safety equipment is necessary for the furnace 10. For processing CZT, since the furnace only operates at the 1100° C. temperature for less than 10 minutes during homogenization, such as for about 5 minutes, instead of many days the furnace life is increased dramatically. For the cold-walled compounding versions that require translation of the ampoule, the furnace and ampoule have a translation motor and linear bearing stage (not shown) for relative positioning of the ampoule at growth rates 0.01 to 10 mm/day depending on the compound. Translation systems commonly used in crystal growing industry, are suitable. Other furnace types, including RF and optical heating type furnaces may also be used.

Five detailed examples will illustrate embodiments of the cold-walled vessel methods for specific compounds, that result in suitable feedstock for subsequent growth of large dimensioned bulk single crystal enabling high performance radiation detector applications and the like, fabricated from the single crystals. The methods selected for the two phases; of synthesis first then homogenization/consolidation, are described as appropriate to the compound being prepared. Five examples of the embodied methods are shown in Table 1 below for key materials of interest, CZT, CdTe, ZnTe and CZT with excess Te formulated as a Te-rich solvent for subsequent growth processes. In general, the processes with a rapid quench result in near-stoichiometric compound, and the non-quenched processes result in compounds substantially closer to stoichiometric. Herein, the terms near-stoichiometric and stoichiometric will be used respectively, but the term stoichiometric is not intended to mean perfectly stoichiometric.

TABLE 1

Cold-walled Vessel Compounding Processes and Treatments

| FIG. | Compound Type | Synthesis and Method of Controlling Exothermic Reaction | Homogenizing and consolidation Method | Quench Type |
|---|---|---|---|---|
| 2 | Stoichiometric CZT | Excess solvent | Translation separation | None |
| 3 | Near-Stoichiometric CZT | Drip addition | Temperature spike above MP of CZT | Rapid Air Quench |
| 4, 5 | CZT - excess Te | Excess Te | Temperature spike above MP of CZT | Rapid Air Quench |
| 6 | ZnTe | Drip addition (Te solvent) | Translation separation | None |
| 7 | CdTe | Drip addition | Temperature spike above MP of CdTe | Rapid Air Quench |

Figure 2:
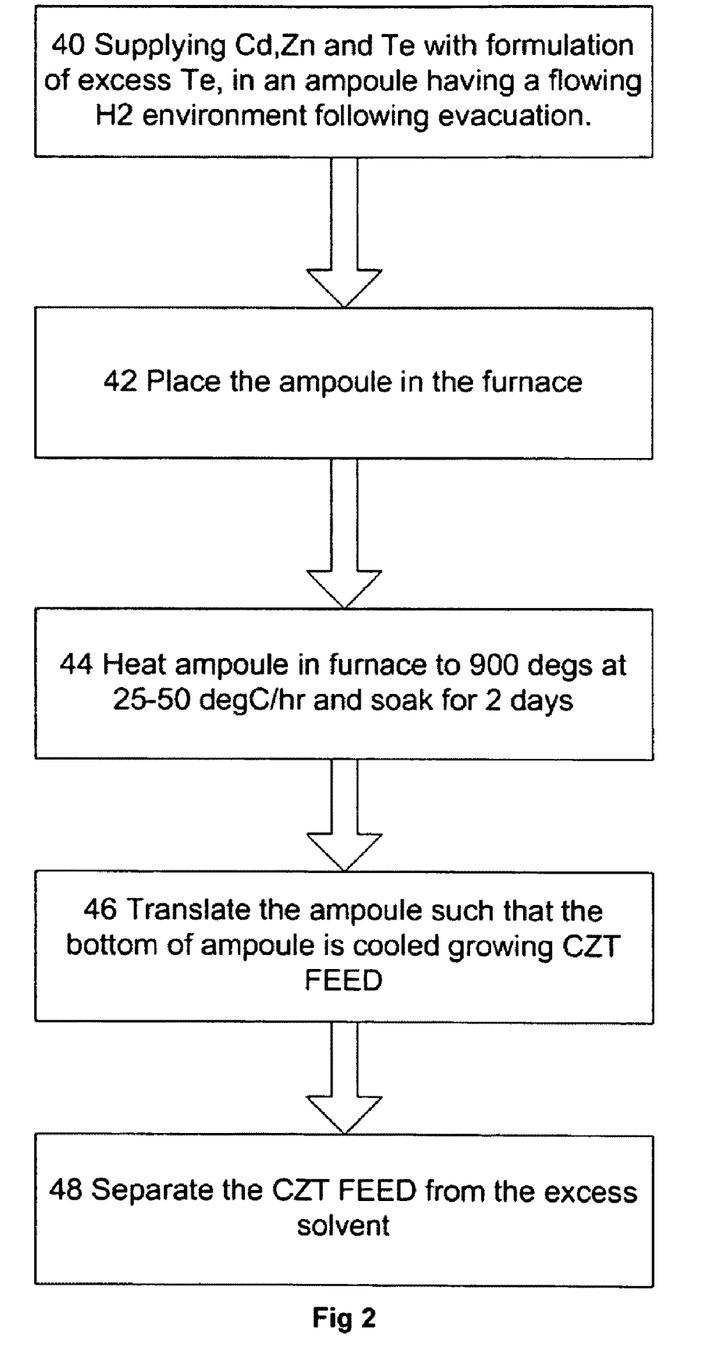
FIG. 2: METHOD OF PREPARING CZT USING EXCESS SOLVENT AND TRANSLATION: This figure shows the steps of a method of compounding, homogenizing and consolidating CZT in a controlled reaction with excess solvent.

The cold-walled vessel method illustrated in FIG. 2 is for preparing stoichiometric CZT. The method of controlling the exothermic reaction is by using an excess of Te solvent. An example of the formulation of the charge materials demonstrates the excess;

| | |
|---|---|
| Cd: | 101.18 gm |
| Zn: | 9.51 gm |
| Te: | 644.6 gm |

In step 40, the charge formulation is supplied as the above example, prepared in the ampoule 01 and sealed with a top cap (not shown). The ampoule 01 is pumped down to high vacuum through the valves in the top cap, then flowing hydrogen gas is introduced. Standard cleaning and handling techniques are used when preparing the materials and loading the ampoule and drip cup. In step 42, the ampoule is placed in the furnace. In step 44, the furnace 10 temperature is increased such that the entire charge is heated simultaneously at the start of the process, above a temperature and for a duration in which the constituents are mixed. Specifically for CZT, the charge is heated to ~900° C. at a heating rate of 25-50° C./hr, then allowed to soak at that temperature for 2 days to allow for mixing. Next, in step 46, the bottom of the ampoule is translated slowly out of the heating zone, such that the polycrystalline CZT cools and solidifies as the excess Te is drawn to the heated area. A typical translation rate is 2 mm/day. At this rate a typical feed amount is synthesized after approximately 18 days. In step 48, following furnace cool down, the excess Te is separated from the compound. This embodiment of the compounding process produces high quality stoichiometric CZT feed suitable for use in crystal growth processes. The process is lengthy and, therefore, costly.

Figure 3:
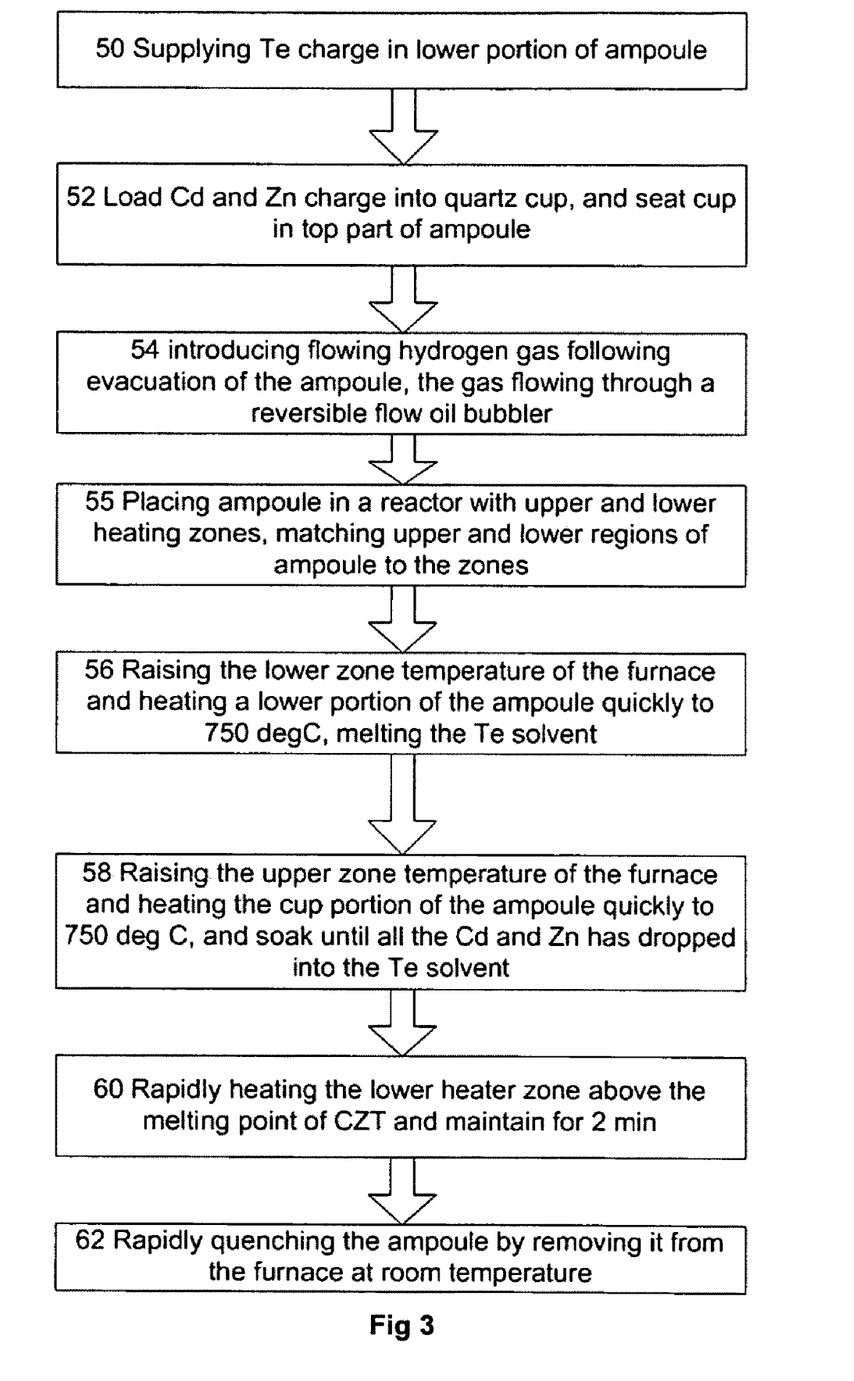
FIG. 3: METHOD OF PREPARING CZT USING CONTROLLED ADDITION: This figure shows the steps of a method of compounding, homogenizing and consolidating CZT by a controlled addition of Cd and Zn into Te solvent.

The compounding method shown in FIG. 3 is for preparing near-stoichiometric CZT. The method of synthesis in the first stage is controlling the exothermic reaction by the Drip addition method. The method of homogenizing and consolidating is by a rapid heating spike above CZT's melting point. An example of the formulation of the charge materials is below;

| | |
|---|---|
| Cd: | 192.9 gm |
| Zn: | 12.5 gm |
| Te: | 248.5 gm |

For the cold-walled vessel process of preparing CZT polycrystalline feed, starting in step 50, a charge of Te and dopant is placed in the bottom of the ampoule 01. Then in step 52, elemental Cd and Zn are placed in the drip cup 96 which is then positioned in the upper tapered zone of the ampoule 01. The ampoule is sealed, evacuated to a vacuum and then flowing hydrogen gas is introduced in step 54. Standard cleaning and handling techniques are used when preparing the materials and loading the ampoules and cup. Next in step 55, the ampoule 01 with drip cup 96 is positioned in the two zone furnace (not shown), such that the lower portion 03 of the ampoule is positioned in a first heater zone (not shown) and the second heater zone is located at the drip cup 96.

Next, the bottom 03 and upper 04 tapered zones are heated separately such that the Cd and Zn are slowly melted and "dripped" through the cup hole 95 by gravity and drops into the molten Te in the bottom of the ampoule 01, in a controlled addition process. The Cd and Zn are together in the second zone. The Cd is the lower melting point and drips first—the Cd and Zn melting points are 321° C. and 420° C. respectively. The Zn and ZnTe follow the Cd melt, and there may be some alloy formation in the cup prior to drip. The slow incremental addition of small amounts of Cd and Zn in this case does not require a vacuum seal or evacuation of byproduct gases. An advantage of the process is that Cd and Zn surface oxides are left on the cup surfaces. The angled hole in drip cup 96 allows for pressure equilibrium between the lower reaction zone of the solvent and area above the cup in the ampoule. The dimensions of the ampoule and cup holes are demonstrative of an operable apparatus, but may be varied within the constraint that the reaction of the drips is controllable. In contrast to the single heater zone of the first embodiment, the drip feed requires two independent heater zones (not shown), one for the lower portion of the ampoule and one for the upper cup region of the ampoule, which can easily be provided by stacking two furnaces 10 with independent temperature control for each. An alternative that may produce better drip addition control, would be to use a premade Cd 10% Zn alloy (having melting point ~375° C.), however there are practical complications to making and quenching of this alloy that make the prior method the preferred method.

In step 56, the lower heater is heated rapidly to 750° C., melting the Te solvent, note that due to the flowing hydrogen, the process has hydrogen reducing the molten Te surface. In step 58, the upper heater is heated quickly to 750° C. triggering the Cd and Zn to melt at a controlled rate. This rate is determined empirically by trial and error and manually observing the strength of reaction at various drip rates and hole sizes. It has been found that dropping large chunks of Cd and Zn is not controllable. The hole size of the cup at 5 mm, with the specified operating temperature, was found to work well. The heating continues until all the charge materials in the upper cup have dropped into the solvent.

The materials are now mixed but not homogenous or consolidated. To accomplish this the mix is heated above the melting point of the CZT and maintained for approximately 2 min as shown in step 60. Note, that this is a much smaller period of time than VGF or alternate melt compounding methods, which remain "hot walled" for extended periods of many days. Finally, in step 62, the ampoule is air quenched by removing it from the furnace. The hydrogen gas is still flowing, and the ampoule can be cooled on a stand in a box with circulating air. The quenched ingot has the correct near-stoichiometry to act as high quality CZT feed for the THM process. The resulting ingot is comparable in quality to VGF compounded material but has been produced much more quickly, in far less expensive apparatus and a much lower risk of explosion.

An alternate version of this process was developed briefly with the following modifications;

In Step 56 heat from room temp to 580° C. at 200° C./hr heating rate and soak for 4 hours.

In the homogenizing heating phase, Step 58, raise temperature to 890° C. at 25° C./hr and hold for 1 hour. This phase allows for more complete mixing of the constituents, so the boule is suitable as high quality feedstock for crystal growing processes.

Step 60 raise the temperature to ~1100-1120° C. and hold there for 10 minutes.

The temperature ranges given are relative to one embodiment. The described furnace and ampoule configuration were designed so that the rate of melt is suitably slow so as to not cause a runaway reaction in the Te solvent. Other ranges and temperature cycles may be applicable for other furnace, ampoule and cup configurations, and be within the scope of the invention. The furnace is selected so that the heating rate of change is slow. The heater of the example embodiment has a power rating of 2000 watts. This heating cycle can be controlled automatically by a heater controlled with calibrated thermocouples, and the cycle set points are determined empirically.

Figure 4:
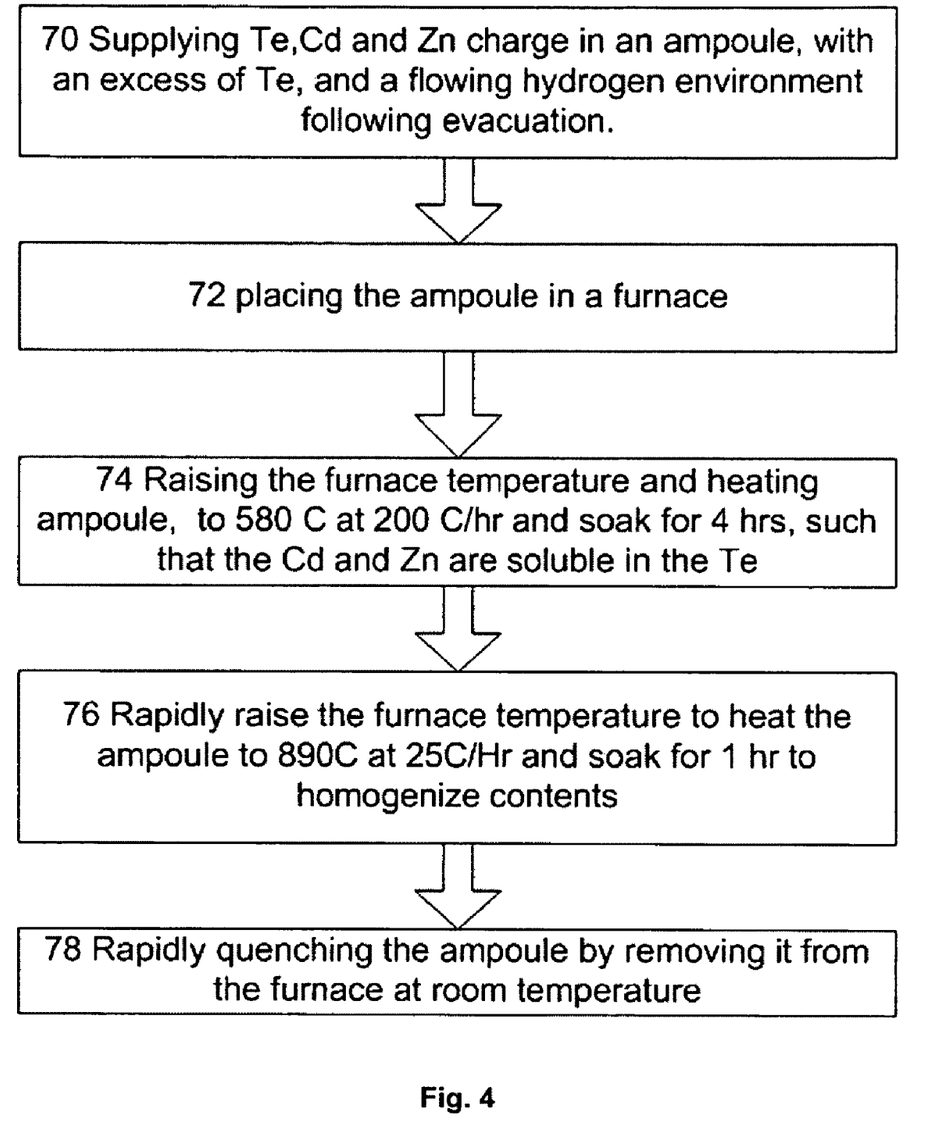
FIG. 4: METHOD OF PREPARING A PRESATURATED SOLUTION OF CZT WITH EXCESS TE: This figure shows the steps of an embodiment to prepare a presaturated solution of CZT.

The cold-walled vessel process shown in FIG. 4 is for preparing a pre-saturated solvent formulation of CZT with excess Te for use in a THM crystal process. For this process, the Te does not have to be separated and the entire charge is quenched. The synthesis method controls the exothermic reaction using an excess of Te, and the homogenizing method is a temperature spike above the melting point of CZT (1100° C.). An extended heater zone (not shown) is used to heat the entire charge. An example of the formulation of the charge materials is below;

| | |
|---|---|
| Cd: | 130 gm |
| Zn: | 6 gm |
| Te: | 641 gm |

In step 70, all charge materials are loaded in the ampoule and the ampoule 01 is sealed with the top cap (not shown). The ampoule is pumped under vacuum and ambient hydrogen gas is introduced. The ampoule is placed in a furnace in step 72. In step 74, the furnace temperature is increased such that ampoule is heated to 580° C. at 200° C./hr and soaked for 4 hrs, creating a liquid phase of the Te solvent. The homogenizing heating is done in step 76, rapidly heating the ampoule beyond the temperature resulting in 100% solubility. In this example, heating to 890° C. at 25° C./hr and soaking for 1 hour. The ampoule is quenched rapidly to room temperature in step 78. The total elapsed time is only several hours, resulting in efficient low cost production.

Figure 5:
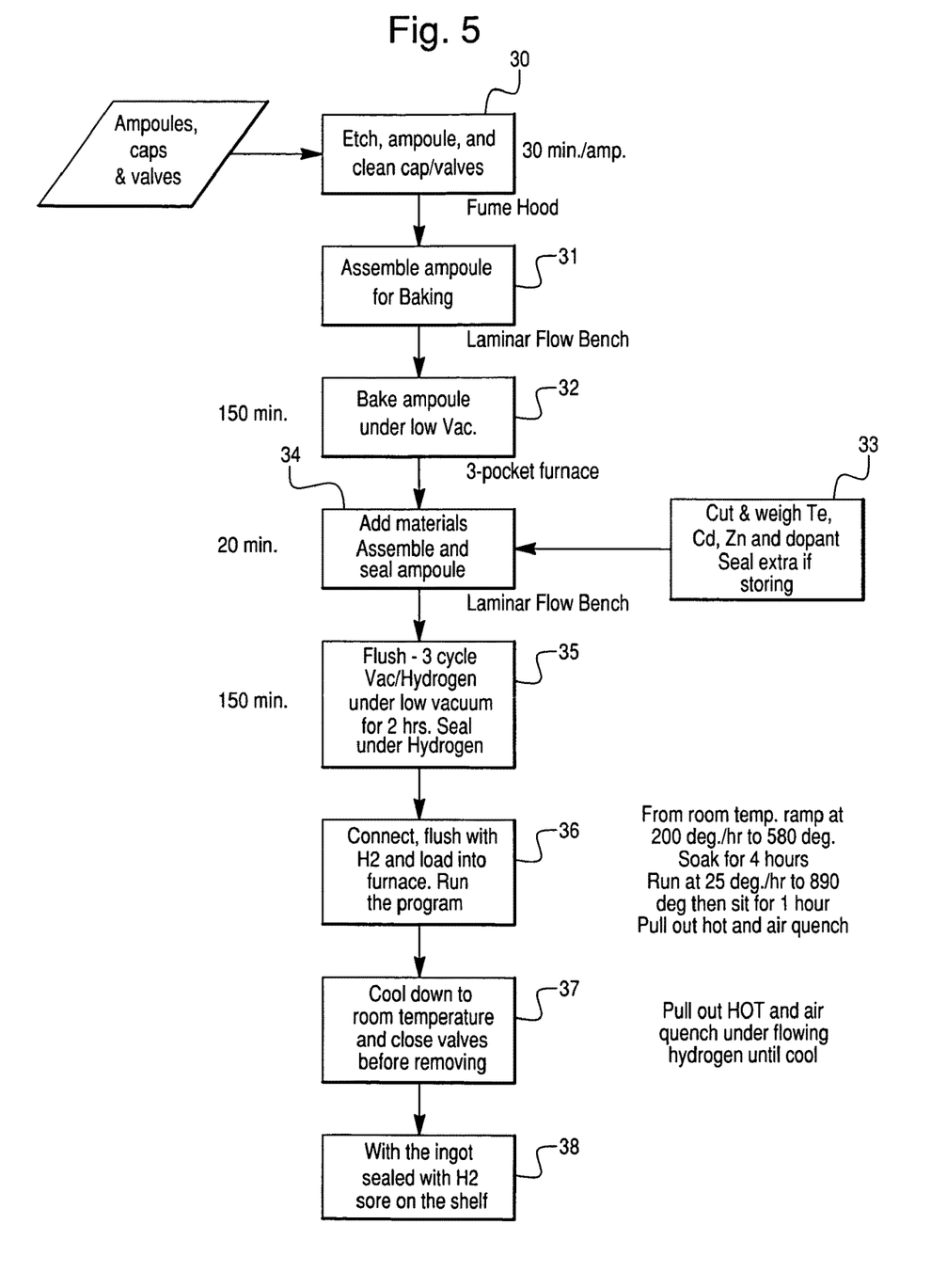
FIG. 5: DETAILED METHOD OF PREPARING A PRESATURATED SOLUTION OF CZT WITH EXCESS TE: This figure shows the detailed steps of an alternate embodiment to form a presaturated solution of CZT.

A detailed embodiment is shown in FIG. 5 to prepare the same formulation used in FIG. 4 method, showing the additional steps of cleaning and processing. The quartz ampoule is cleaned by etching, and the caps and valves are cleaned in step 30. The ampoule and caps are assembled for baking in step 31. The ampoule is baked for 150 minutes under low vacuum in step 32. Charge materials are cut and weighed to formulation in step 33. The charge materials are added to the ampoule, which is assembled in step 34. The loaded ampoule is flushed under low vacuum in a hydrogen environment in step 35. The ampoule is loaded in the furnace and heated at 200° C./hr to 580° C., soaked for 4 hours, then heated to 890° C. at 25° C./hr and soaked for 1 hour. In step 37, the ampoule is air quenched under flowing hydrogen until cool. The ingot is removed and sealed in step 38 for further use.

Figure 6:
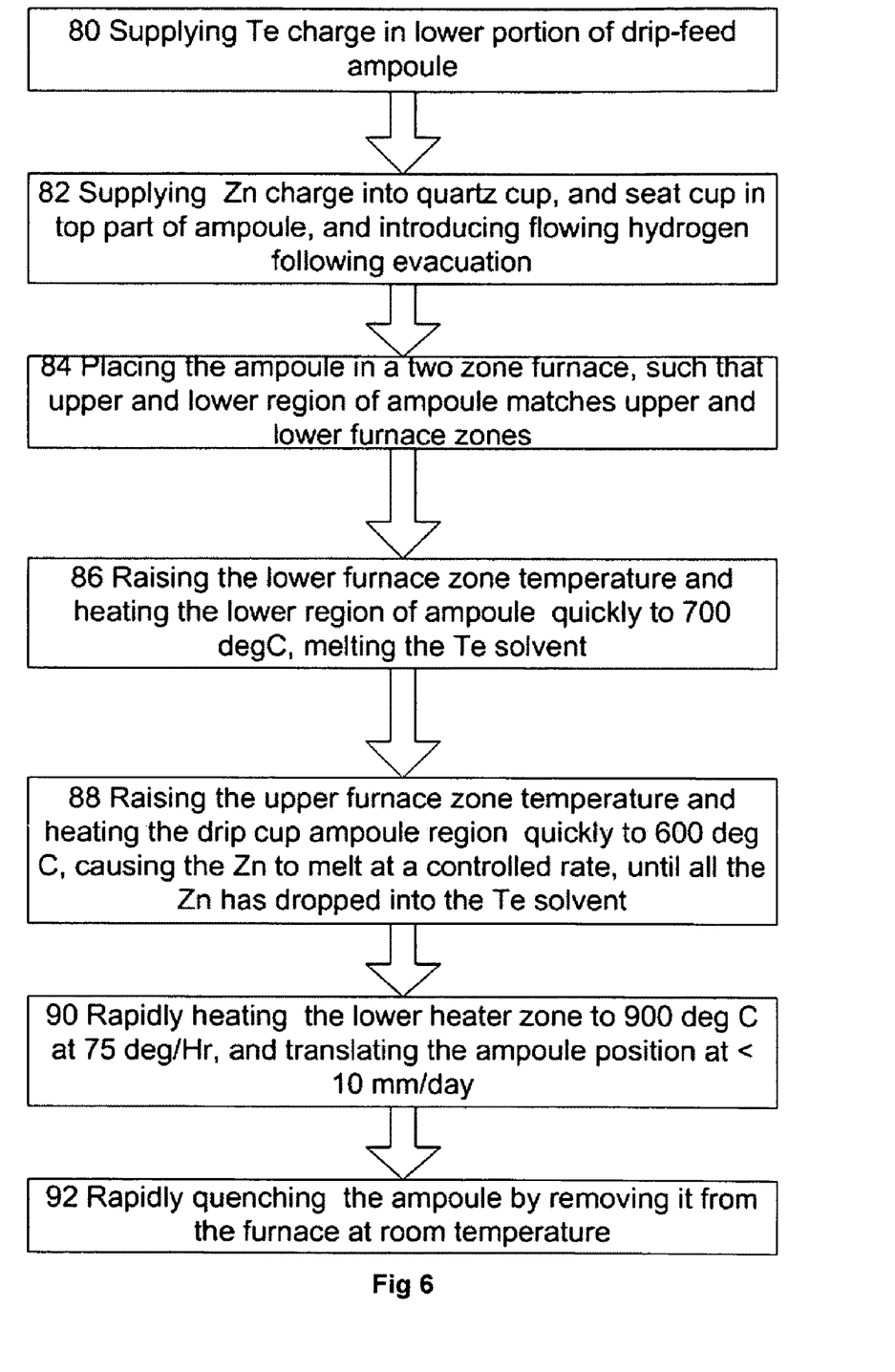
FIG. 6: METHOD OF PREPARING ZnTe USING CONTROLLED ADDITION: This figure shows the steps of an embodiment for compounding, homogenizing and consolidating ZnTe using a controlled addition of Zn into Te solvent.

The cold-walled vessel processes shown in FIG. 6 is for preparing stoichiometric ZnTe, and operates far below its melting point of 1300° C., while maintaining desired stoichiometry, so that the ingot can be used as feedstock for a wide range of commercial applications. The synthesis method is the Drip addition method with an excess of Te. The method of homogenizing and consolidation is by translation separation. As discussed in the previous Drip-addition process, a two-zone heater is required. An example of the formulation of the charge materials is below;

| | |
|---|---|
| Zn: | 70 gm |
| Te: | 106 gm |

In step 80, the solvent Te charge is loaded in the lower portion of the ampoule 01. Next in 82, loading Zn into the quartz drip cup 96, seating the cup in the upper portion of the ampoule 01 and sealing the ampoule with a top cap (not shown). The ampoule is pumped under vacuum and flowing hydrogen ambient gas introduced. In step 84 the ampoule is placed in a two-zone furnace (not shown) such that upper and lower regions of the ampoule match the upper and lower zones of the furnace, which can be independently heated. The lower portion of the ampoule 01 with Te is rapidly heated to 700° C. in a two-heater furnace in step 86, melting the Te solvent entirely. The Zn in the drip cup 96 is melted at a controlled drip rate by heating the upper portion of the ampoule 05 in the upper furnace or heater, to 600° C., until all the Zn has melted. In step 90, the lower portion of the ampoule is rapidly heated by the lower heater, to 900° C. at 75° C./hr, followed by translation of the ampoule relative to the furnace at 7 mm/day to separate the solvent. Alternatively, for the translation process, the ampoule may be transferred to a translating furnace setup from the original two-stage heater furnace.

Figure 7:
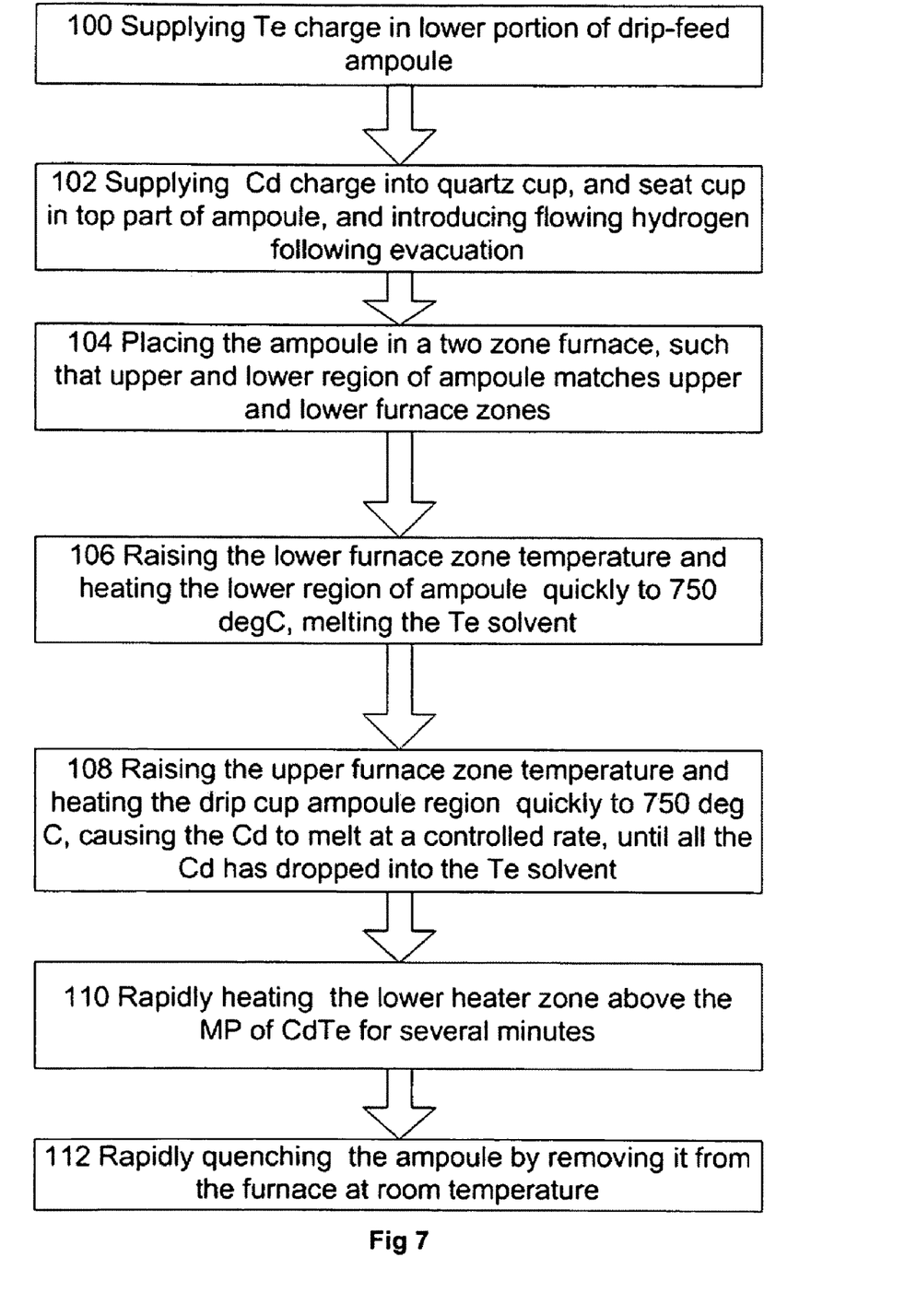
FIG. 7: METHOD OF PREPARING CdTe USING DRIP ADDITION: This figure shows the steps of an embodiment for by compounding, homogenizing and consolidating CdTe using a controlled addition of Cd into Te solvent.

The cold-walled vessel method shown in FIG. 7 is for preparing near-stoichiometric CdTe, at temperatures far below melting point of ~1100° C., while maintaining desired stoichiometry, so that the ingot can be used as feedstock for a wide range of commercial applications. The synthesis method is the Drip addition method. The method of homogenizing and consolidation is by high temperature spike above the melting point of CdTe. The charge formulation is below;

| | |
|---|---|
| Cd: | 323 gm |
| Te: | 367 gm |

With respect to FIG. 7, first the Te is loaded in the lower portion of the ampoule per step 100. Then the Cd is placed in the drip cup 96 and the cup seated in the top portion of the ampoule 01 and sealed with a top cap in step 102. Hydrogen gas is introduced into the ampoule vacuum through the cap. In step 104, the ampoule is placed in the two-zone furnace (not shown) such that the upper and lower portions of ampoule match the upper and lower heating zones of the furnace, which can be independently heated. The lower portion of the ampoule is heated quickly to 750° C. to melt the Te solvent using the lower heating element in 106. The cup portion of the ampoule is heated quickly to 750° C., and maintained until all the Cd has dropped into the Te below in step 108. The first phase of synthesis is now done, ready for the homogenizing phase. In step 110, the lower ampoule portion is rapidly heated above the melting point of CdTe, and maintained for 2 minutes to homogenize the mixture. Finally in step 62, the charge is rapidly quenched in air by removing it from the furnace. The resultant CdTe is near-stoichiometric and has been produced quickly, typically in less than 6 hours.

There are many alternate embodiments for various cold-wall vessel processes for compounding, homogenizing and consolidating compounds. For the Drip method, there could be multiple holes in the bottom of the drip cup 96 or a automated mechanical method of adding the materials, such as by pellet holders etc. The drip rate may be adjusted for different proportions of constituents and solvent concentrations, as well as furnace set points. The shape of the ampoule 01 can also be non-cylindrical (but is preferably symmetric). High purity hydrogen is used but lower purity hydrogen will work as well. Other inert gases such as argon may be suitable. Various heating, cooling and soak cycles different from the examples listed may also be used depending on the compound. The basic premise of the invention is that the synthesis happens at cold-walled temperatures, lower by several hundred degrees than the relevant melt temperatures. The use of a temperature spike treatment happens after the primary synthesis.

The advantages of the embodiments described herein include a) the system does not require expensive explosion-proof equipment, b) unexpectedly, the Cd vapour pressure is controlled at low levels during the process, c) when using Zn charge material, zinc oxide in the upper portion remains coated to the walls of the cup and does not contaminate the boule, which can easily be removed, d) the highest temperature long duration soak is >200° C. lower than conventional melt process temperatures, resulting in much less quartz contamination in the CZT compound, e) the speed of processing and cooling cycle are a big improvement over known compounding processes, f) apparatus advantages: the ampoule and cup can be reused many times in the process, substantially reducing production costs.

In general, the cold-walled vessel processes for compounding, homogenizing and consolidating compounds can be used for CdTe compounds, such as would be useful for solar cells, and can also be used for other exothermic metal compounds, with appropriate scaling and calibration to compensate for different chemical properties. The methods can be applied to a wide range of CZT concentrations, for example changing the Zn concentration from 0 (CdTe) to 0.07 to 0.09 (CZT) depending on the application. The process is orders of magnitude faster than the alternate VGF process, which may take many days.

We have discovered a non-VGF process for compounding, homogenizing and consolidating ZnTe in a cold-walled vessel. The technique was then applied to preparing pre-saturated solvent for CZT crystal growth, and a rapid quench was used to speed the overall process. Further enhancements were made to use the process for CZT feed with controlled addition of the CdZn using a specialized ampoule system, and again a rapid quench to maintain properties of the feed. The resulting feed of highly polycrystalline CZT of uniform composition was suitable to be used in a THM to grow high quality CZT crystals. Detector devices fabricated from CZT single crystals grown using feed compounds prepared by the methods herein resulted in desirable detector response.

The reader will appreciate that the foregoing description is only intended to be illustrative of the present invention and is, therefore, not to be construed to a limitation or restriction thereon. This application claims benefit of priority of Canadian application serial number 2,510,415 filed on Jun. 21, 2005 which is incorporated herein by reference in its entirety.

The invention claimed is:

1. An apparatus for making a compound, comprising:
a first means for holding a solute dissolved in a solvent in a first portion of the first means and for subsequently solidifying the solvent and solute to form the compound;
a second means for flowing an inert gas through the first means such that resulting vapor pressure surges from an exothermic reaction of mixing the solvent and the solute is absorbed in the flowing inert gas; and
a third means for maintaining the first portion of the first means at a temperature above which the solute is soluble in the solvent, while a second portion of the first means which is located adjacent to an inert gas inlet is maintained at a temperature at which a vapor pressure of the solute is 1 torr or less.

2. A method of making a compound, comprising:
providing a solute mixed in a solvent in a first portion of a vessel;
maintaining the first portion of the vessel at a temperature above which the solute is soluble in the solvent;
flowing an inert gas through the vessel such that resulting vapor pressure surges from an exothermic reaction of mixing the solvent and the solute is absorbed in the flowing inert gas;
maintaining a second portion of the vessel which is located adjacent to an inert gas inlet at a temperature at which a vapor pressure of the solute is 1 torr or less; and
solidifying the solvent and solute to form the compound.

3. The method of claim 2, wherein the step of providing a solute mixed in a solvent in the first portion of the vessel comprises providing a first solid material and a second solid material into the first portion of the vessel and melting the first and the second material at a temperature below a liquidus temperature of the compound.

4. The method of claim 2, wherein the step of providing a solute mixed in a solvent in the first portion of the vessel comprises:
providing a first solid material into the first portion of the vessel and melting the first material to form the solvent; and
providing a second solid material into a second vessel, melting the second material to form the solute and adding a controlled amount of liquid solute into the solvent while maintaining the solvent at a temperature below a liquidus temperature of the compound.

5. The method of claim 2, wherein the step of solidifying comprises homogenizing and consolidating a mixture of the solvent and the solute to form a solid compound of the first material and the second material.

6. The method of claim 2, wherein the compound comprises a compound semiconductor material.

7. The method of claim 6, wherein the solvent comprises a Group VI material, the solute comprises a Group II material and the compound comprises a Group II-VI compound semiconductor material.

8. The method of claim 7, wherein the solvent comprises Te, the solute comprises Zn, Cd or ZnCd, and the compound comprises a ZnTe, CdTe or CdZnTe compound semiconductor material.

9. The method of claim 5, wherein the step of homogenizing and consolidating the mixture comprises cooling the mixture by removing heat from the mixture.

10. The method of claim 5, wherein the step of homogenizing and consolidating the mixture comprises heating the mixture above the liquidus temperature of the compound to homogenize the mixture and quenching the mixture to consolidate the mixture into the solid compound.

* * * * *